(12) United States Patent
Moser et al.

(10) Patent No.: US 7,702,488 B2
(45) Date of Patent: Apr. 20, 2010

(54) MEASURING DEVICE FOR CAPACITIVE PRESSURE MEASURE

(75) Inventors: Helmut Moser, Heilbronn (DE); Thomas Saile, Forchtenberg (DE)

(73) Assignee: Atmel Automotive GmbH, Heilbronn (DE)

(*) Notice: Subject to any disclaimer, the term of this patent is extended or adjusted under 35 U.S.C. 154(b) by 0 days.

(21) Appl. No.: 11/638,588

(22) Filed: Dec. 14, 2006

(65) Prior Publication Data

US 2007/0143059 A1 Jun. 21, 2007

(30) Foreign Application Priority Data

Dec. 21, 2005 (DE) ................ 10 2005 061 090

(51) Int. Cl.
*G06F 19/00* (2006.01)
*G06F 17/40* (2006.01)

(52) U.S. Cl. .............. 702/189; 73/146.3; 73/718; 340/442; 340/626; 341/128; 341/167; 702/1; 702/57; 702/127; 702/130; 702/138; 702/190; 702/191; 702/194

(58) Field of Classification Search ............... 324/676, 324/677, 76.16, 76.11, 76.13, 500, 537, 548, 324/600, 649, 658, 661, 678, 686; 702/65, 702/138, 140, 64, 1, 57, 127, 130, 187, 189, 702/190, 191, 194; 327/151, 1, 100, 131, 327/14, 144, 160; 377/49, 1, 19, 27; 341/11, 341/128, 1, 126, 127, 155, 166, 167, 168; 368/11, 10; 73/146, 146.2, 146.3, 700, 715, 73/716, 717, 718, 723, 724; 340/825.5, 438, 340/442, 500, 540, 603, 626
See application file for complete search history.

(56) References Cited

U.S. PATENT DOCUMENTS 3,761,805 A 9/1973 Dornberger (Continued)

FOREIGN PATENT DOCUMENTS

EP 0 370 630 A2 5/1990

OTHER PUBLICATIONS

G. Rademaker et al., "A Clock-Shot A/D Converter for Integrated Smart Sensors," IEEE 1990 Bipolar Circuits and Technology Meeting 9.1, Sep. 17, 1990, pp. 206-209; XP010007981.

(Continued)

*Primary Examiner*—Edward R Cosimano
(74) *Attorney, Agent, or Firm*—Munch, Geissler, Olds & Lowe, PLLC (57) ABSTRACT

A measuring device is disclosed for capacitive pressure and/or temperature measurement, particularly for tire pressure control systems, having at least one sensor, which has a capacitive measuring element to detect a state value, which is applied at an output-side measuring node of the measuring element, with at least one A/D converter operating according to the dual-slope method, with a charging/discharging circuit, for mutual charging and discharging of the measuring element and for generating a sawtooth-shaped measuring potential at the measuring node as a measure for the capacitance of the measuring element, with a period counter, which determines the periods of the measuring potential, and with a clock counter, which determines the cycles of a clock signal, which lie within the duration of at least one period of the measuring potential. The invention relates to a measuring method for capacitive pressure and/or temperature measurement.

19 Claims, 3 Drawing Sheets

U.S. PATENT DOCUMENTS

| | | | |
|---|---|---|---|
| 4,618,848 A * | 10/1986 | Parfitt | 341/118 |
| 5,012,247 A | 4/1991 | Dillman | |
| 5,189,376 A | 2/1993 | Roberge et al. | |
| 5,394,343 A * | 2/1995 | Tsao | 702/140 |
| 6,191,723 B1 | 2/2001 | Lewis | |
| 6,275,047 B1 | 8/2001 | Zoellick et al. | |
| 6,609,419 B1 * | 8/2003 | Bankart et al. | 73/146.5 |
| 2008/0258956 A1 * | 10/2008 | Konrad et al. | 341/155 |

OTHER PUBLICATIONS

A. Cichocki et al., "Switched-Capacitor Self-Oscillating Capacitance Transducers With Duty-Cycle or Digital Output," European Conference on Circuit Theory and Design, 1989; pp. 185-189; XP006612211.

Christopher Hierold et al., "A Pure CMOS Surface-Micromachined Integrated Accelerometer," Sensors and Actuators A, Nov. 1996, vol. 57, No. 2, pp. 111-116; XP004073447; ISSN: 0924-4247.

Schrüfer, Elmar., "Elektrische Messtechnik," Hanser Verlag, Vienna, $3^{rd}$ Edition, 1988; pp. 374-377.

Rohwer, Klaus, "Precise measurement of capacity—simply," 1995, http://www.klausrohwer.de/privat/hobbies/elektro/cmess/index/htm.

Tietze, Ulrich et al., "Halbleiter Schaltungstechnik," $11^{th}$ Edition, 1999, Springer Verlag, pp. 1058-1062.

Schulz, Werner, "Integrierter Drucksensor wird drahtlos versorgt," Elektronik Jul. 2000, p. 54.

* cited by examiner

MEASURING DEVICE FOR CAPACITIVE PRESSURE MEASURE

This nonprovisional application claims priority under 35 U.S.C. §119(a) on German Patent Application No. DE 102005061090, which was filed in Germany on Dec. 21, 2005, and which is herein incorporated by reference.

BACKGROUND OF THE INVENTION

1. Field of the Invention

The present invention relates to a measuring device and a measuring method for capacitive pressure and/or temperature measurement, such as, for example, for tire pressure control systems. Although it can be used in principle in any pressure and temperature measuring devices, the present invention and its underlying situation will be described below with reference to wireless pressure and temperature measuring devices with use of transponders and here particularly for tire pressure control systems.

2. Description of the Background Art

Transponders are microelectronic elements, which are designed to be able to store information. For this purpose, transponders have an antenna array to enable contactless reading out and modification of the stored information. In the case of transponders, an electromagnetic signal transmitted by the base station is received by the transponder and demodulated.

Active, semipassive, and passive transponders are differentiated depending on the design of their energy supply. In contrast to active transponders, passive transponders do not have their own energy supply, so that the passive transponder obtain the energy necessary for demodulating and decoding the received electromagnetic signal from the electromagnetic signal itself. This occurs by absorption modulation of the transmitted electromagnetic waves. In currently employed passive 110-140 kHz transponder systems, this is realized in the electromagnetic near field by inductive coupling. The energy range achieved thereby is within the range of a few centimeters to about half a meter and depends inter alia on the specific national HF regulations.

Passive transponders are employed in the field of contactless communication for identification (RFID=Radio Frequency Identification), in tire pressure control systems, and the like. In the case of a tire pressure control system, typically piezoresistive or capacitive pressure sensors are employed for determining tire-specific parameters, particularly tire pressure and tire temperature, whereby the present invention relates also to capacitively designed pressure sensors.

The absolute value of the capacitance of the pressure sensor, which corresponds to the actual tire pressure of the automobile tire, is to be determined by the capacitive pressure sensor. The tire temperature is determined in a similar way with the internal reference capacitance. In this case, the temperature-dependent charge of the reference capacitor is evaluated. A voltage is applied to the pressure sensor to measure this capacitance. The charge stored in the capacitor of the pressure sensor, which thereby contains information on the actual tire pressure, is subsequently determined in an AD converter using suitable converter methods. The challenge in determining the actual tire pressure from the charge stored by this capacitor now is the highest measuring accuracy possible, a resolution of less than one per thousand being required in current tire pressure control systems.

A/D converters used today or conventional corresponding converter methods in fact perhaps achieve such a high accuracy in the resolution, but do not take into account the integratability of the pressure sensor. In particular, the capacitive pressure sensor for tire pressure measurements as a component of an integrated circuit, which is disposed on a wheel of a vehicle or vulcanized into its rubber material, must be as small as possible and therefore made area-optimized. A/D converters and capacitive pressure sensors in use today, which are designed for a high accuracy, are not suitable here or only suitable conditionally when designed for this. Moreover, these have a relatively long converter time to determine the capacitance of the capacitive pressure sensor and thereby the actual tire pressure. A long converter time, however, is directly associated with a high energy consumption, which is essential to avoid, however, particularly in tire pressure control systems in which the transponder must obtain the energy from the electromagnetically transmitted signal.

A pressure and temperature sensor with wireless transmission of measured data for microelectronic circuits is described in the article by Werner Schulz, "A wireless integrated pressure sensor" in the journal Elektronik, 7/2000, page 54. As a result of the low power consumption, the current supply can be obtained here from the field of a base station up to a meter away.

In the German textbook by Tietze and Schenk "Semiconductor Circuit Technology," 11th edition, pages 1059-1060, a generally known so-called dual-slope method is described, furthermore, by means of which the capacitance of a capacitor can be determined.

SUMMARY OF THE INVENTION

It is therefore an object of the present invention to provide a method for capacitance measurement for a capacitive pressure sensor, which provides in particular as high a resolution as possible. Another object is to provide a corresponding method for capacitance measurement with as low an energy consumption as possible.

Accordingly, provided are a measuring device for capacitive pressure and/or temperature measurement, particularly for tire pressure control systems, having at least one sensor, which has a capacitive measuring element to detect a state value, which is applied at an output-side measuring node of the measuring element, with at least one A/D converter operating according to the dual-slope method, with a charging/discharging circuit, for mutual charging and discharging of the measuring element and for generating a sawtooth-shaped measuring potential at the measuring node as a measure for the capacitance of the measuring element, with a period counter, which determines the periods of the measuring potential, and with a clock counter, which determines the cycles of a clock signal, which lie within the duration of at least one period of the measuring potential.

A measuring method for the capacitive pressure measurement, particularly for tire pressure control systems, particularly by the measuring device of the invention, in which a measurement of a measuring potential of a capacitive element to be measured is repeated multiple times, to average out an uncorrelated noise, which occurs due to an exceeding or falling of the measuring potential above the top reference threshold or below the bottom reference threshold, respectively.

A dual-slope measuring method is can be used for measuring the capacitance of the capacitive pressure sensor. The particular advantage of this type of dual-slope measuring method, compared with other measuring methods, is its higher measuring accuracy. To improve this measuring accuracy even further, in the method of the invention, the measurement of the charge in the capacitor of the capacitive pressure sensor and thereby for determining the capacitance is repeated multiple times, to average out in this way the uncorrelated noise of the reference thresholds, which is typically inherent to the dual-slope measuring method. This noise results because a particular rising or falling slope of the measuring signal is not switched precisely at the reference thresholds, as is ideally the case, but continues slightly beyond the specific reference threshold. The particular advantage in the measuring device of the invention or in the corresponding measurement method therefore is the very high measuring accuracy due to the multiple execution of the dual-slope measuring method. In this way, a single undesirable charging is theoretically distributed among several measuring cycles, as a result of which measuring accuracies are averaged out.

The particular advantage here is also that a lower supply voltage can be used by this measuring method, because a significantly lower supply voltage is required for the comparatively low slope in the case of the employed clock signal versus the measuring signal.

In order to correct further the error in switching at the reference thresholds, preferably two correction measurements can be made before the actual measurement. In these correction measurements, first a simple capacitance value and then a double capacitance value are measured. The difference between these two correction measurements indicates the lag, which must be taken into account afterwards in the calculation of the actual capacitance value of the capacitive pressure sensor. The capacitance values of the single capacitance value and of the double capacitance value are known very precisely and therefore can be used as reference for the actual capacitance measurement. In this way, a dual-slope method divided into several cycles can be corrected and also expanded as desired without the switching errors adding up.

In an preferred, an oscillator is provided which generates an oscillator clock signal on the output side, whose frequency is at least higher than the frequency of the measuring potential.

In another embodiment, the period counter on the output side outputs a first counter reading signal as a measure for the counted periods of the measuring potential. The clock counter on the output side outputs a second counter reading signal as a measure for the counted cycles of the clock signal. Typically, but not necessarily, the period counter and/or the clock counter is/are made as an up- or down-counter. These increment or decrement by plus one their counter readings with each period of the measuring potential or with each cycle of the clock signal.

In a preferred development, the charging/discharging circuit has at least one switchable current source to generate the sawtooth-shaped measuring potential. For this purpose, the charging/discharging circuit in each case can have at least one first current source for charging a capacitive element to be measured in each case and at least one second current source in each case for discharging the capacitive element to be measured in each case. For a mutual charging and discharging, at least one controllable switch is disposed between each current source and the measuring node. Typically, the controllable switch is driven by a control signal derived from the measuring potential in such a way that either the first or the second current source is activated thereby.

In an embodiment, the charging/discharging circuit, to generate the sawtooth-shaped course of the measuring potential, can have a threshold switch, which is connected downstream of the measuring node, which compares the measuring potential with a predefined top and bottom threshold value and which changes the control signal to drive the controllable switches with the exceeding of the measuring potential above the top threshold value or falling of the measuring potential below the lower threshold value in such a way that the charging/discharging process of the element to be measured is thereby reversed.

In another embodiment, the sensor has a capacitor array, which contains, in addition to the measuring element, to determine the state value, at least one capacitive reference element as reference for the measuring element.

In yet another embodiment, the capacitor array further can have at least two correction capacitors, which are provided for averaging out an uncorrelated noise, which arises when the measuring potential exceeds a top reference threshold or falls below a bottom reference threshold. Typically, a first correction capacitor has a double capacitance value compared with the second correction capacitor.

Typically, however, but not necessarily, the state value is a tire-specific parameter, particularly the tire pressure or the tire temperature. For this purpose, the sensor can be a capacitive pressure sensor to determine a pressure.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

In the figures of the drawing, the same and substantially functionally identical elements, features, and signals, if not specified otherwise, are provided with the same reference characters.

Figure 1A:
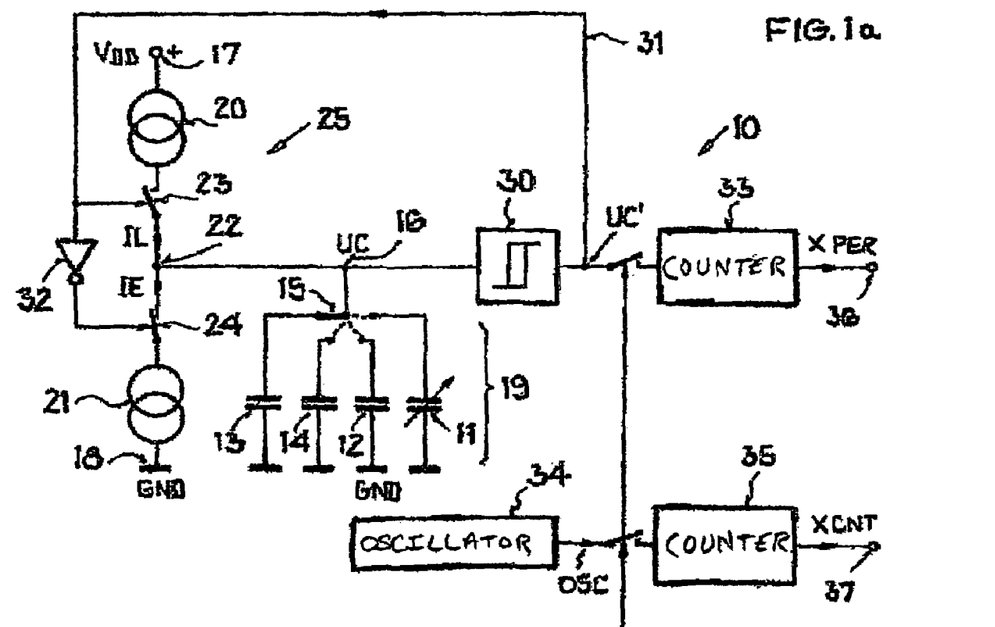
FIG. 1a is a block diagram of a measuring device according to an embodiment of the invention, to determine a capacitance value of a capacitive pressure sensor.

FIG. 1a shows a block diagram of a measuring device that determines a capacitance value of a capacitive pressure sensor. The measuring device of the invention is used to determine tire-specific parameters by a capacitive pressure sensor. Tire-specific parameters are taken to mean, e.g., the actual tire pressure or the actual tire temperature.

This measuring device according to an embodiment of the invention is designated with the reference character 10 in FIG. 1a. Measuring device 10 contains a capacitor array 19 with a capacitive pressure sensor 11, whose capacitance CP can vary within the range of typically CP=5-20 pF, depending on the tire pressure to be measured. This capacitance CP is determined by measuring device 10 as a measure for the tire pressure. For this purpose, capacitor array 19 further has a reference capacitor 12 and two correction capacitors 13, 14. Reference capacitor 12, which is to be used as a reference for the measurement, has a reference capacitance value of, for example, CREF=8 pF. The tire temperature is determined using the same measuring method with CREF=8 pF. For this purpose, two measurements are also necessary as in the tire pressure determination. Hereby, the charge at CREF is compared with a temperature-dependent and temperature-independent value.

The two correction capacitors 13, 14 have the purpose of correcting a measurement error and the accompanying measurement accuracies during switching at the specific reference thresholds. First correction capacitor 13 has a capacitance value of, e.g., COR0=1 pF. Second correction capacitor 14 has double the capacitance value compared with first correction capacitor 13, therefore in the shown example of COR1=2 pF.

Measuring device 10 has two supply terminals 17, 18. First supply terminal 17 has a first supply potential VDD, for example, a positive DC voltage potential VDD, whereas second supply terminal 18 is supplied with a second supply potential GND, for example, a reference potential GND.

Capacitors 11-14 of capacitor array 19 are each connected on one side to second supply terminal 18. Furthermore, a controllable switch 15 is provided, by which at least one of these capacitors 11-14 can be connected to measuring node 16. A measuring potential UC, which thereby corresponds to the charge stored in the connected capacitors 11-14, is therefore applied at the measuring node 16.

For the measuring method of the invention with use of a dual-slope measuring method, these capacitors 11-14 of capacitor array 19 must be mutually charged and again discharged. A current source array 25 is provided for this purpose. Current source array 25 has two current sources 20, 21. First current source 20 is used to charge capacitors 11-14 connected in each case and is disposed for this purpose between first supply terminal 17 and a tap 22, which forms the output of current sources 20, 21. Tap 22 is connected to measuring node 16. For charging a specific capacitor 11-14, further, a controllable switch 23 is provided, across which with a closed switch 23, current source 20 generates a charging current IL to charge a specific capacitor 11-14. Second current source 21, which is connected to second supply terminal 18, is used to discharge a specific capacitor 11-14 with a discharge current IE, provided that a controlled switch 24, disposed between second current source 21 and tap 22, is closed.

Controllable switches 23, 24 can be made, for example, as simple MOSFET transistors (CMOS technology) or as bipolar transistors (bipolar technology).

The measuring device of the invention 10 contains further a threshold circuit 30, which predetermines an internally predefined top and bottom threshold value UH, UL for the measuring potential UC. Threshold circuit 30 takes up the measuring potential UC and compares this measuring potential UC with the top and bottom threshold value UH, UL. The measuring potential UC' provided at the output of threshold circuit 30 is used via feedback path 31 to drive the two controllable switches 23, 24, whereby this signal UC' is used for the direct driving of controllable switch 23 and via an inverter 32 to drive controllable switch 24.

First, with a closed switch 23 a capacitor 11-14, to be measured of capacitor array 19 is charged with charging current IL. The corresponding, slowly rising charging of capacitor 11-14 leads to an increase in measuring potential UC, which is compared with the top threshold value UH in threshold circuit 30. If the measured potential UC exceeds the top threshold value UH, this leads to a signal inversion in the output signal UC', which immediately causes switch 23 to be opened and switch 24, which was initially open, to be closed. In this way, the appropriate capacitor 11-14 of capacitor array 19 is discharged with discharge current IE. The corresponding, slowly declining charge and thereby declining measuring potential UC is compared with the bottom threshold value UL in threshold circuit 30. If the measured potential UC falls below the bottom threshold value UL, this leads to a signal inversion in the output signal UC, which immediately causes switch 24 to be opened again and switch 23 to be closed. The measuring potential UC thereby describes a sawtooth-shaped measuring course, as shown in FIG. 1b.

Furthermore, a period counter 33 is provided, which determines the individual periods 38 of the sawtooth-shaped signal UC. At output 36 of period counter 33, a counter reading signal XPER can therefore be tapped. Counter reading signal XPER indicates how many complete periods 38 of signal UC were counted. In the example in FIG. 1a, a total of four and a half periods 38 of measuring signal UC during the time period T=TB−TA are shown.

Furthermore, an oscillator 34 is provided which provides an oscillator clock signal OSC on the output side. The individual cycles 39 of the clock signal OSC are also counted in a measuring counter 35 specially provided for this. At output 37 of measuring counter 35, therefore, a counter reading signal XCNT can be tapped, which indicates how many cycles 39 of clock signal OSC were counted within a predefined time period.

Figure 1B:
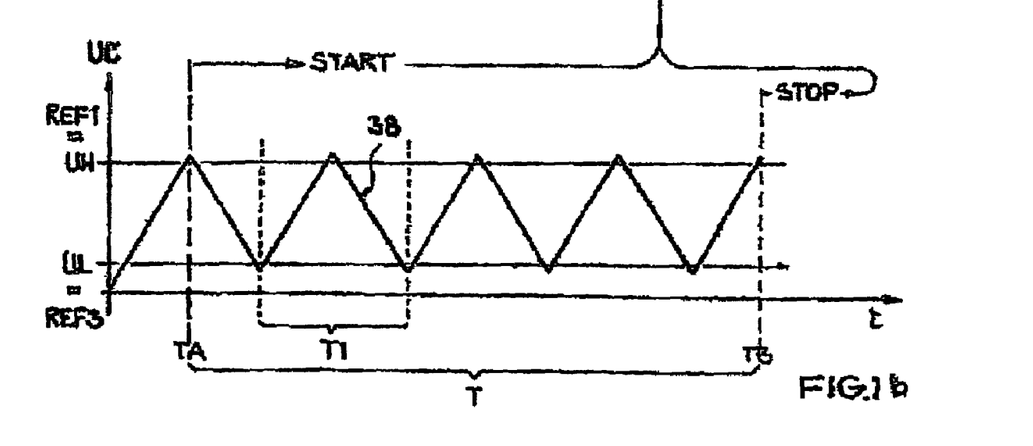
FIG. 1b is a signal-time course of the measuring potential to show the measuring method, according to the invention, of the measuring device of FIG. 1.

FIG. 1b shows the course of the measuring potential UC with use of a signal-time diagram. Reference character 38 here indicates an individual period of duration T1 of measuring potential UC. Period counter 33 is designed to determine all periods 38 of measuring potential UC within the measuring duration T. This measuring duration T results from the time between the start of the measurement at time TA and up to the stopping of the measurement at time TB. The starting time TA is typically selected so that it is selected at a fixedly predefined time relative to the measuring potential UC, for example, to its maximum (or alternatively also to its minimum). The stop condition TB depends in each case on which of the capacitors 11-14 are to be measured. The stop condition TB is determined particularly from the number of counted periods 38 of measuring potential UC or from the counted cycles 39 of the clock signal OSC.

The measuring method of the invention to determine the capacitance CP of capacitive pressure sensor 11 will be described next with use of FIGS. 2, 3 and 4.

Figure 2:
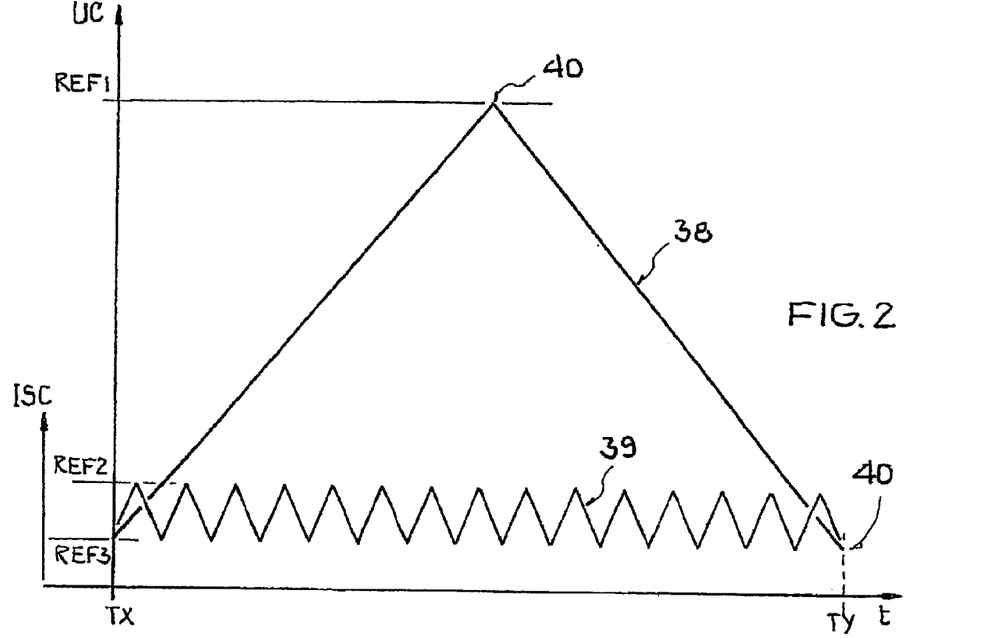
FIG. 2 is a signal-time diagram of a single period of the measuring signal.

FIG. 2 shows a signal-time diagram in the region of a single period of measuring potential UC to illustrate the operation mode of period counter 33 and measuring counter 35. The beginning of period 38 is designated here with TX and the end with TY. Within this time period T1=TY−TX, a total of 15 cycles 39 of clock signal OSC are provided. Measuring counter 35 measures these cycles, whereas periods 38 are counted by period counter 33. In an embodiment, the measuring potential UC has an amplitude maximum REF1 and an amplitude minimum REF3, which correspond to the upper and lower threshold value UH or UL, respectively. The clock signal OSC has an amplitude maximum REF2 and the amplitude minimum REF3. The amplitude maximum REF2 here is significantly smaller than the amplitude maximum REF1.

In the dual-slope measuring method, only a single charging and discharging are carried out. This is shown with use of the measuring curve for period 38. In so doing, however, inaccuracies can occur due to an uncorrelated noise in region 40 of the top and bottom reference thresholds REF1, REF3. This uncorrelated noise typically leads to a reduction in the accuracy of this dual-slope measuring method, as explained herein above. In the measuring method of the invention, the individual cycles 39 of the clock signal OSC, which are present within the single period 38 of the measuring signal UC, are measured. In fact, here as well there is an uncorrelated noise of the specific reference thresholds REF2, REF3. However, here a slope method and particularly a dual-slope method are carried out multiple times. The uncorrelated noise of the specific reference thresholds REF2, REF3 is averaged out by means of this multiple run of the dual-slope method. The advantage here is also that a lower supply voltage can be used by this measuring method, because for the comparatively small slopes a significantly lower supply voltage VDD-GND is required in the case of the clock OSC signal versus the measuring signal UC.

Figure 3:
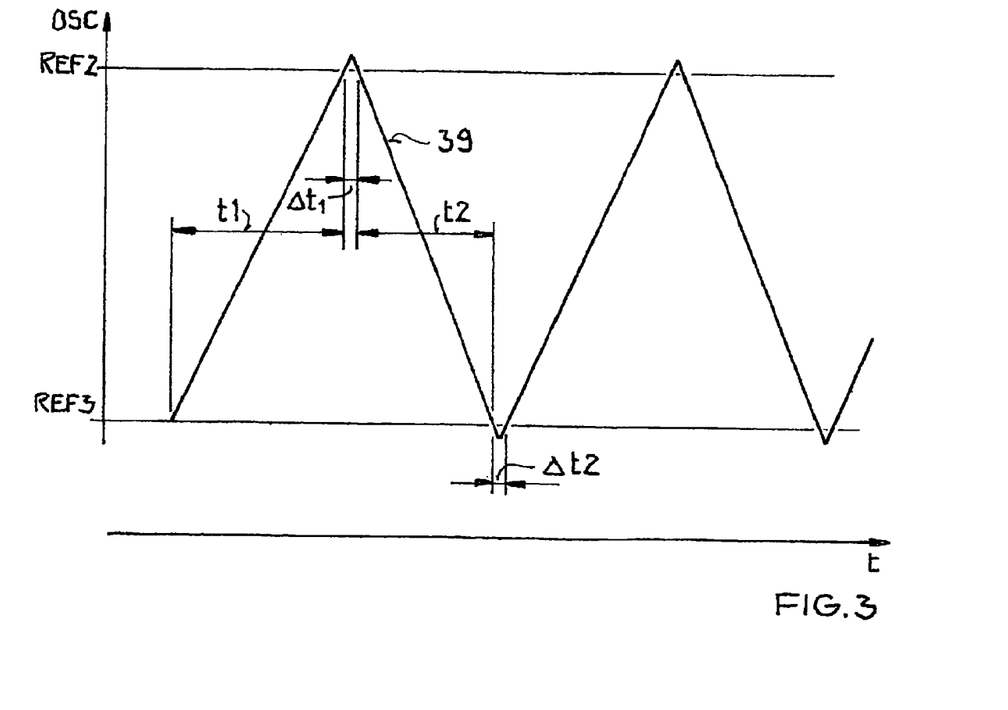
FIG. 3 is a signal-time diagram of two cycles of a clock signal.
Figure 4:
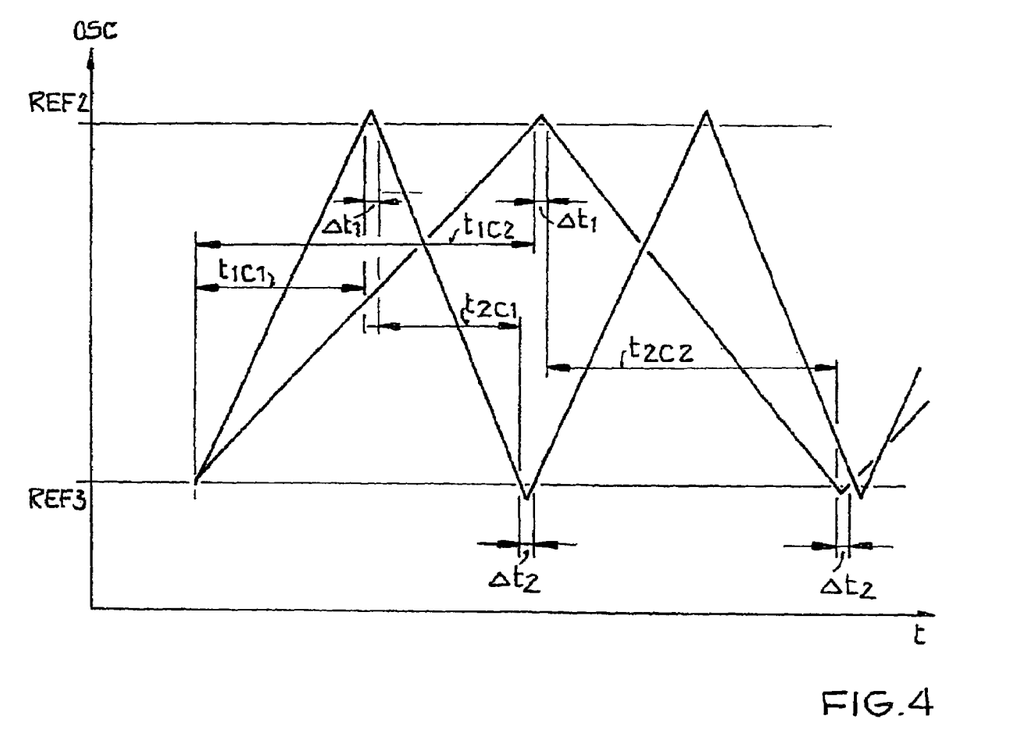
FIG. 4 is a signal-time diagram of two cycles of the clock signal.

FIGS. 3 and 4 show two signal-time diagrams to illustrate a switching error $\Delta t_1$ and $\Delta t_2$ for the reference thresholds REF2, REF3, which can arise in the dual-slope method. To be able to determine this switching error $\Delta t_1$ and $\Delta t_2$ as accurately as possible, two correction measurements are made by using correction capacitors 13, 14. In this way, a switching error in the capacitance measurement to determine the sensor capacitance CP of pressure sensor 11 can be compensated. The switching errors are also not added up by the multiple carrying out of the dual-slope method for several periods 38 or several cycles of the clock signal OSC.

The method of the invention is to be explained below with use of these FIGS. 3 and 4.

During charging and discharging with a current source, the time course of a voltage U(t) at any capacitor depending on the current I and time t can be calculated as follows:

$$U(t)=1/C*I*t$$

First, only one period (see FIG. 4) is examined. In two correction capacitances $C_2$, $C_1$, of which one is twice as large as the other, therefore for the correlation $$C_2=2*C_1,$$

the following correlation results theoretically, because the measuring time increases only by the capacitance to be measured, but the switching errors enter only once regardless of the capacitance to be measured:

$$t_{C2}=2*t_{C1}$$

$$t_{1C2}=2*t_{1C1}$$

$$t_{2C2}=2*t_{2C1},$$

The actual measurement time per period results from:

$$t_{C1}=t_{1C1}+\Delta t_1+t_{2C1}+\Delta t_2$$

$$t_{C2}=t_{1C2}+\Delta t_1+t_{2C2}+\Delta t_2$$

Due to the double run time of capacitance C1 compared with the run time of capacitance C2, thereby two periods are covered, as a result of which in comparison with capacitance C2 the switching error in the second period of capacitance C1 must be subtracted. Because capacitance behaves proportional to time (see above), the following applies:

$$t_{C2}=2*t_{C1}-\Delta t_1-\Delta t_2$$

$$t_{1C2}+\Delta t_1+t_{2C2}+\Delta t_2=2*t_{1C1}+\Delta t_1+2*t_{2C1}+\Delta t_2$$

Thus, switching errors $\Delta t_1$ and $\Delta t_2$ can be subtracted from both sides of the equations and the following correlation results:

$$t_{1C2}+t_{2C2}=2*t_{1C1}+2*t_{2C1}$$

The pure capacitance-dependent measuring time remains:

$$t_{1C2}+t_{2C2}=2*(t_{1C1}+t_{2C1})$$

For the actual pressure and temperature measurements, the following six measurements are now performed, which are listed in short form in the following Table 1.

TABLE 1

| | Description | Stop condition | Period number (period counter) | Counter reading (measuring counter) |
|---|---|---|---|---|
| 1st measured value | Correction measurement (COR0) | Periods = 128 | COR0_PER | COR0_CNT |
| 2nd measured value | Correction measurement 1 (COR1) | Periods = 64 | COR1_PER | COR1_CNT |
| 3rd measured value | Pressure measurement (P_REF) reference capacitor | Cycles >2048 | P_REF_PER | P_REF_CNT |
| 4th measured value | Pressure measurement (P_MEAS) pressure sensor | Cycles >1024 | P_MEAS_REF | P_MEAS_CNT |
| 5th measured value | Temp. measurement (T_REF) referenced capacitor | Cycles >2048 | T_REF_PER | T_REF_CNT |
| 6th measured value | Temp. measurement (T_MEAS) pressure sensor | Cycles >1024 | T_MEAS_PER | T_MEAS_CNT |

The first column shows the successive six measuring steps for the pressure and temperature measurement. The second column indicates which measured value is to be measured, whereby the specific correction capacitance is to be measured with COR0, COR1. With P_REF and P_MEAS, the specific reference pressure and measuring pressure are to be determined with use of reference capacitor 12 or a pressure sensor (measuring sensor) 11. With T_REF and T_MEAS, the particular reference temperature and measuring temperature are to be determined. The third column shows the necessary period count or clock count and thus the stop condition, which are counted by period counter 33 or measuring counter 35 and in which a specific measurement is regarded as ended. The fourth column shows the particular measurement result based on the period count measured by period counter 33 and the fifth column shows the corresponding counter reading of the corresponding counter 35. The measurement values designated with "PER" should signal that the appropriate period count was measured here. The values given with "CNT" indicate that the result is from the specific counter reading.

The following standardizations were performed for the measurements:

$$COR\_NOM = \frac{COR0\_CNT - COR1\_CNT}{COR0\_PER - COR1\_PER}$$

$$P\_REF\_NOM = \frac{P\_REF\_CNT}{P\_REF\_PER}$$

$$P\_MEAS\_NOM = \frac{P\_MEAS\_CNT}{P\_MEAS\_PER}$$

$$T\_REF\_NOM = \frac{T\_REF\_CNT}{T\_REF\_PER}$$

$$T\_MEAS\_NOM = \frac{T\_MEAS\_CNT}{T\_MEAS\_PER}$$

The following corrections were calculated furthermore for the measurements:

$$P\_REF\_COR = P\_REF\_NOM - COR\_NOM$$

$$P\_MEAS\_COR = P\_MEAS\_NOM - COR\_NOM$$

$$T\_REF\_COR = T\_REF\_NOM - COR\_NOM$$

$$T\_MEAS\_COR = T\_MEAS\_NOM - COR\_NOM$$

Using the values measured in the above Table 1 and the corresponding standardizations and corrections, the capacitance CP and the temperature TP of the capacitive pressure sensor 11 can be calculated as follows.

$$CP = C_0 * \frac{P\_MEAS\_COR}{P\_REF\_COR} * C_{gradient} + C_{offset}$$

$$TP = T_0 * \frac{T\_MEAS\_COR}{T\_REF\_COR} * T_{gradient} + T_{offset}$$

The constants are determined, for example, with 9 measuring runs. The sensor capacitance CP is to be between 5 and 20 pF and to be measured at 233 and 398 Kelvin. The basic setting for determining the above constants is as follows:

$$C_0 = 1; C_{gradient} = 1; C_{offset} = 0$$

$$T_0 = 1; T_{gradient} = 1; T_{offset} = 0$$

The constants $C_0$, $C_{gradient}$, $C_{offset}$ in the above equations can be calculated as follows for the capacitance measurement:

$$C_0 = \text{Mean of} \left( \frac{20 \text{ pF}}{\text{Mean} \frac{P\_MEAS\_COR}{P\_REF\_COR} \text{of 20 pF measurements}}; \frac{8 \text{ pF}}{\text{Mean} \frac{P\_MEAS\_COR}{P\_REF\_COR} \text{of 8 pF measurements}}; \frac{5 \text{ pF}}{\text{Mean} \frac{P\_MEAS\_COR}{P\_REF\_COR} \text{of 5 pF measurements}} \right)$$

$$C_{gradient} = \frac{\frac{20 \text{ pF}}{C_0} / \left[ \text{Mean} \frac{P\_MEAS\_COR}{P\_REF\_COR} \text{of 20 pF measurements} \right]}{\frac{5 \text{ pF}}{C_0} / \left[ \text{Mean} \frac{P\_MEAS\_COR}{P\_REF\_COR} \text{of 5 pF measurements} \right]}$$

$$C_{offset} =$$

$$\text{mean of} \left( 20 \text{ pF} - \left[ \text{Mean}\left( C_0 * \frac{P\_MEAS\_COR}{P\_REF\_COR} * C_{gradient} \right) \right]_{\text{of 20 pF measurements}} + 8 \text{ pF} - \left[ \text{Mean}\left( C_0 * \frac{P\_MEAS\_COR}{P\_REF\_COR} * C_{gradient} \right) \right]_{\text{of 8 pF measurements}} + 5 \text{ pF} - \left[ \text{Mean}\left( C_0 * \frac{P\_MEAS\_COR}{P\_REF\_COR} * C_{gradient} \right) \right]_{\text{of 5 pF measurements}} \right)$$

Furthermore, the constants $T_0$, $T_{gradient}$, $T_{offset}$ in the above equations for the temperature measurement can also be calculated as follows:

$$T_0 = \text{Mean of} \left( \frac{398 \text{ K}}{\text{Mean} \frac{T\_MEAS\_COR}{T\_REF\_COR} \text{of 398 K measurements}}; \frac{300 \text{ K}}{\text{Mean} \frac{T\_MEAS\_COR}{T\_REF\_COR} \text{of 300 K measurements}}; \frac{233 \text{ K}}{\text{Mean} \frac{T\_MEAS\_COR}{T\_REF\_COR} \text{of 233 K measurements}} \right)$$

$$T_{gradient} = \frac{\frac{398 \text{ K}}{T_0} / \left[ \text{Mean} \frac{T\_MEAS\_COR}{T\_REF\_COR} \text{of 398 K measurements} \right]}{\frac{233 \text{ K}}{T_0} / \left[ \text{Mean} \frac{T\_MEAS\_COR}{T\_REF\_COR} \text{of 233 K measurements} \right]}$$

$$T_{offset} =$$

$$\text{mean of} \left( 398 \text{ K} - \left[ \text{Mean}\left( T_0 * \frac{T\_MEAS\_COR}{T\_REF\_COR} * T_{gradient} \right) \right]_{\text{of 398 K measurements}} + 300 \text{ K} -$$

-continued $$\left[\text{Mean}\left(T_0 * \frac{\text{T\_MEAS\_COR}}{\text{T\_REF\_COR}} * T_{gradient}\right)\text{ of 300 K measurements}\right] +$$

$$233\ K - \left[\text{Mean}\left(T_0 * \frac{\text{T\_MEAS\_COR}}{\text{T\_REF\_COR}} * T_{gradient}\right)\text{ of 233 K measurements}\right]\Big)$$

Although the present invention was described more closely above with use of a specific and preferred exemplary embodiment, it is not limited thereto, but can be changed and modified as desired within the scope of the invention. In particular, it is understood that the selected numerical data are to be taken only as examples, but are not intended to limit the invention. This also applies to the selected circuit elements and circuit parts, which were shown as simply as possible for the sake of better clarity. It is understood that the measuring device of the invention can be expanded and modified as desired.

Of course, the invention is also not exclusively suitable for a tire pressure control system and also not necessarily exclusively suitable for determining tire-specific parameters. Rather, the invention can be advantageously used in other measuring devices and for other converter methods.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A measuring device for capacitive pressure and/or temperature measurement for tire pressure control systems, the measuring device comprising:
    at least one sensor, which has a measuring element for detecting a state value that is applied at an output-side measuring node of the measuring element;
    at least one A/D converter operating according to a dual-slope method;
    a charging/discharging circuit for charging and discharging the measuring element and for generating a sawtooth-shaped measuring potential at the measuring node as a measure for a capacitance of the measuring element;
    a period counter, which determines the periods of the measuring potential; and
    a clock counter, which determines cycles of a clock signal that lie within a duration of at least one period of the measuring potential.

2. The measuring device according to claim 1, further comprising an oscillator that generates an oscillator clock signal on an output side, a frequency of the oscillator clock signal being at least higher than a frequency of the measuring potential.

3. The measuring device according to claim 1, wherein the period counter on an output side outputs a first counter reading signal as a measure for the counted periods of the measuring potential, and wherein the clock counter on the output side outputs a second counter reading signal as a measure for the counted cycles of the clock signal.

4. The measuring device according to claim 1, wherein the period counter and/or the clock counter are an up-counter or a down-counter, which increment or decrement by plus one their counter reading with each period of the measuring potential or with each cycle of the clock signal.

5. The measuring device according to claim 1, wherein the charging/discharging circuit has at least one switchable current source to generate the sawtooth-shaped measuring potential.

6. The measuring device according to claim 1, wherein the charging/discharging circuit, to generate the sawtooth-shaped measuring potential has a threshold switch, which is connected downstream of the measuring node, for comparing the measuring potential with a predefined top and bottom threshold value and which changes the control signal to drive the controllable switches with the exceeding of the measuring potential above a top threshold value or falling of the measuring potential below a lower threshold value in such a way that the charging/discharging process of the element to be measured is thereby reversed.

7. The measuring device according to claim 1, wherein the sensor has a capacitor array, which has, in addition to the measuring element, at least one capacitive reference element as a reference for the measuring element for determining the state value.

8. The measuring device according to claim 1, wherein the state value is a tire-specific parameter, a tire pressure, or a tire temperature.

9. The measuring device according to claim 1, wherein the sensor is a capacitive pressure sensor for detecting a pressure.

10. The measuring device according to claim 1, wherein the measuring element is a capacitive measuring element.

11. The measuring device according to claim 1, wherein the charging/discharging circuit has at least one first current source for charging a capacitive element to be measured in and at least one second current source for discharging the capacitive element to be measured, wherein at least one controllable switch is disposed between each current source and the measuring node for mutual charging and discharging.

12. The measuring device according to claim 11, wherein the controllable switch is driven by a control signal that is derived from the measuring potential in such a way that either the first or the second current source is activated.

13. The measuring device according to claim 1, wherein the capacitor array has at least two correction capacitors, which are provided for averaging out an uncorrelated noise, which arises when the measuring potential exceeds a top reference threshold or falls below a bottom reference threshold.

14. The measuring device according to claim 13, wherein a first correction capacitor has twice a capacitance value as a second correction capacitor.

15. A measuring method for capacitive pressure measurement for tire pressure control systems, the method comprising the steps of:
    providing a capacitive element having a measuring potential that varies with pressure;
    subjecting the capacitive element to a pressure to be measured;
    repeatedly measuring the measuring potential of the capacitive element; and
    averaging an uncorrelated noise, which occurs due to an exceeding or falling of the measuring potential above an upper reference threshold or below a lower reference threshold, respectively.

16. The method according to claim 15, wherein a measuring device repeatedly measures the measuring potential of the capacitive element, the measuring device comprising:
    at least one sensor, which has a measuring element for detecting a state value that is applied at an output-side measuring node of the measuring element;

at least one A/D converter operating according to a dual-slope method;

a charging/discharging circuit for charging and discharging the measuring element and for generating a saw-tooth-shaped measuring potential at the measuring node as a measure for a capacitance of the measuring element;

a period counter, which determines the periods of the measuring potential; and a clock counter, which determines cycles of a clock signal that lie within a duration of at least one period of the measuring potential.

17. The method according to claim 15, wherein a dual-slope measuring method is used for the capacitance measurement.

18. The method according to claim 17, wherein a clock signal, whose frequency is at least higher than a frequency of the measuring potential, is used for measuring the measuring potential.

19. The method according to claim 18, wherein both cycles of the clock signal and a period of the measuring potential are counted.

* * * * *